(12) United States Patent
Goldman et al.

(10) Patent No.: US 7,139,205 B1
(45) Date of Patent: Nov. 21, 2006

(54) APPARATUSES AND METHODS FOR PRE-CHARGING INTERMEDIATE NODES FOR HIGH-SPEED WORDLINE

(75) Inventors: Matthew Goldman, Folsom, CA (US); Kerry D. Tedrow, Folsom, CA (US); Gerald J. Barkley, Oregon, WI (US); Alec W. Smidt, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 86 days.

(21) Appl. No.: 11/026,510

(22) Filed: Dec. 30, 2004

(51) Int. Cl.
*G11C 7/00* (2006.01)
(52) U.S. Cl. ...................................... 365/203; 365/149
(58) Field of Classification Search ................ 365/203, 365/149
See application file for complete search history.

(56) References Cited

U.S. PATENT DOCUMENTS 4,907,200 A * 3/1990 Ikawa et al. ........... 365/189.09
6,058,438 A * 5/2000 Diehl et al. .................... 710/24
6,084,800 A * 7/2000 Choi et al. ............. 365/185.23
6,611,474 B1 * 8/2003 Hanzawa et al. ...... 365/230.06
6,775,177 B1 * 8/2004 Okamoto et al. ........... 365/149
2006/0083068 A1 * 4/2006 Ahn et al. ............. 365/185.18

* cited by examiner

*Primary Examiner*—M. Tran
(74) *Attorney, Agent, or Firm*—Troutman Sanders, LLP; Jeffrey L. Waters

(57) ABSTRACT

An apparatus and method for pre-charging an intermediate node for high-speed wordlines for accessing memory cells in high-speed memory arrays. The apparatus pre-charges a local capacitance located between a wordline supply voltage and the wordline to a voltage level that is greater than the wordline supply voltage. Once the wordline is selected, the charge stored on the local capacitance may be quickly shared with the capacitance of the wordline. The wordline supply voltage may be applied to the local capacitance to provide small, incremental voltage to move the wordline to its final voltage thereby improving the response time of the system.

23 Claims, 4 Drawing Sheets

US 7,139,205 B1

APPARATUSES AND METHODS FOR PRE-CHARGING INTERMEDIATE NODES FOR HIGH-SPEED WORDLINE

BACKGROUND

As microprocessor systems increase in size and speed, there is need for larger and faster memory arrays. These high-speed memory arrays may contain a large number of memory cells. However, as the number of memory elements increases, the time needed to read and/or write to the individual memory cells may also increase. This may be due to the fact that as the number of memory elements increases in an individual array, the length of the wordline between the supply voltage and the individual memory cells may also increase. The increased length of the wordline may directly relate to an increase in the resistance of the wordline. Therefore, as the size of the memory array increases so may the required voltage needed to read the individual memory cells. Additionally, in large memory arrays, the capacitance of the wordline may require an increase in the time required charge to the desired level in order to access a given memory cell. The increase in the time required to charge the may lead to a large cycle time, which may directly limit the access time for the memory. Additionally, the increase in the time required to charge the capacitance may also limit the length of the wordline. As the length of the wordline increases so does the resistance value of the wordline wire. Therefore, the time required to charge the capacitance may be limited by the large RC value associated with a longer wire.

One solution to solve this problem and increase the speed of the memory access time was to break the large single array into a stacked array, which consists of a number of smaller arrays connected in parallel. Although using a stacked memory array may increase access time of the memory cells, there may be several drawbacks associated with using multiple arrays. First, using stacked memory arrays may increase the overall cost of the system. The amount of silicon required to produce a stacked array increases proportionally to the number of memory arrays contained in the stack. Therefore as the number of memory arrays increases, so does the manufacturing costs. In addition, each array in the memory stack may require its own supporting circuitry. Increasing the amount of supporting circuit may also contribute to increasing the manufacturing cost. Next, the stacked memory arrays may increase the load on the system. For example, each individual memory array in the memory stack may be attached to the external bus, which in turn may increase the capacitance load on the external bus. Furthermore, the overall power consumption of the system may be increased due to the increased number of memory arrays.

DETAILED DESCRIPTION OF THE EMBODIMENTS

Figure 1:
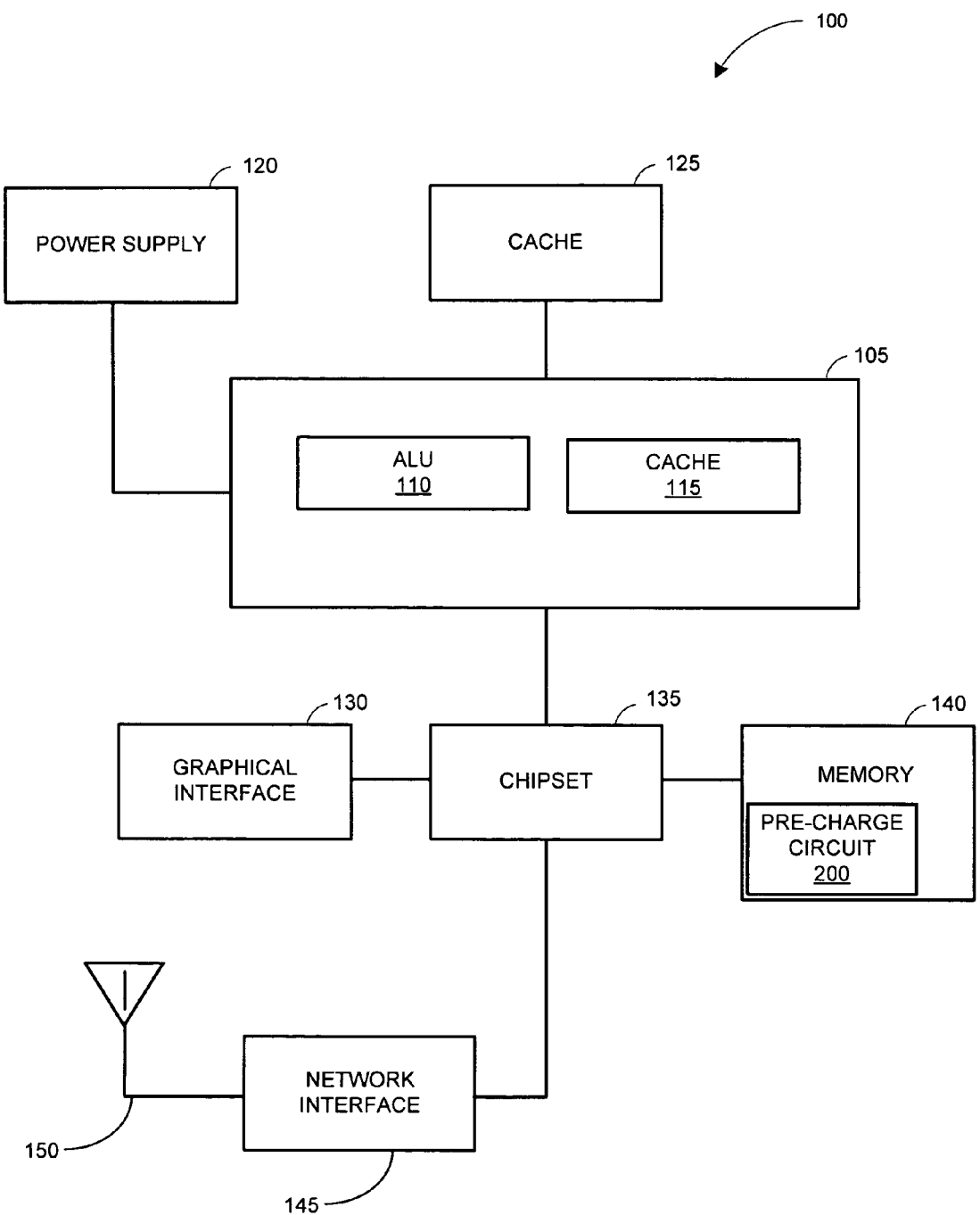
FIG. 1 is block diagram illustrating a system using a pre-charging circuit for pre-charging intermediate nodes in high-speed wordlines in accordance with the present invention.

Referring now to the figures, in which like numerals refer to like elements through the several figures, FIG. 1 is a block diagram illustrating a system 100 utilizing a pre-charging circuit 200 for pre-charging an intermediate node for a high-speed wordline for accessing a particular cell in a memory array. The system 100 may include logic devices capable of receiving logic signals including processor 105, arithmetic logic unit (ALU) 110, memory caches 115, 125, power supply 120. The system 100 may further include other logical devices such as graphical interface 130, chipset 135, memory 140, network interface 145, and an antenna 150 all of which may be connected to processor 105.

The memory 140 may include computer storage media in the form of volatile and/or nonvolatile memory arrays such as read only memory (ROM) and random access memory (RAM). A basic input/output system (BIOS) may contain the basic routines that help to transfer information between elements within system 100, such as during start-up, that may be stored in ROM. RAM may contain data and/or program modules that are immediately accessible to and/or presently being operated on by processing unit 105 through the chipset 135. The memory 140 may also contain a pre-charge circuit 200 for pre-charging intermediate nodes for charging wordlines in high speed memory arrays to access the appropriate memory cells within a given memory array. Although a single pre-charge circuit 200 is shown in the memory 140, more than one pre-charge circuit 200 may be used within the memory 140. Each wordline within each memory array may require a pre-charge circuit 200 to adequately access individual memory cells.

A user may interact with the system 100 through the graphical interface 130, which may include input devices such as a keyboard (not shown) and pointing devices (not shown), commonly referred to as a mouse, trackball, or touch pad. Other input devices may include a microphone, joystick, game pad, satellite dish, scanner, or the like. These and other input devices may be connected to the processing unit 105 through a user input interface that is coupled to the system bus, but may be connected by other interface and bus structures, such as a parallel port, game port or a universal serial bus (USB). The graphical interface 130 may also include a monitor (not shown) or other type of display device that may be also connected to the system bus via an interface, such as a video interface. In addition to the monitor, the graphical interface 130 may also include other peripheral output devices such as speakers and a printer which may be connected through an output peripheral interface.

System 100 may be any system capable of operating in a networked environment using logical connections to one or more remote computers. The remote computer may be a personal computer, a server, a router, a network PC, a peer device or other common network node, and may typically includes many or all of the elements described above relative to the system 100. The logical connections depicted in FIG. 1 may include a local area network (LAN) and a wide area network (WAN), but may also include other networks. Such networking environments may be commonplace in offices, enterprise-wide computer networks, intranets and the Internet.

When used in a LAN networking environment, the system 100 may be connected to a LAN through the network interface or adapter 145. When used in a WAN networking environment, the system 100 may include a modem or other means for establishing communications over the WAN, such as the Internet. The modem, which may be internal or external, may be connected to the system bus via the user input interface or other appropriate mechanism. In a networked environment, program modules depicted relative to the computer 110, or portions thereof, may be stored in the remote memory storage device. Additionally, when the networking environment is a wireless environment, the system 100 may also include an antenna 150 connected to the network interface 145 for transmitting and receiving data over the wireless networking environment.

Figure 2:
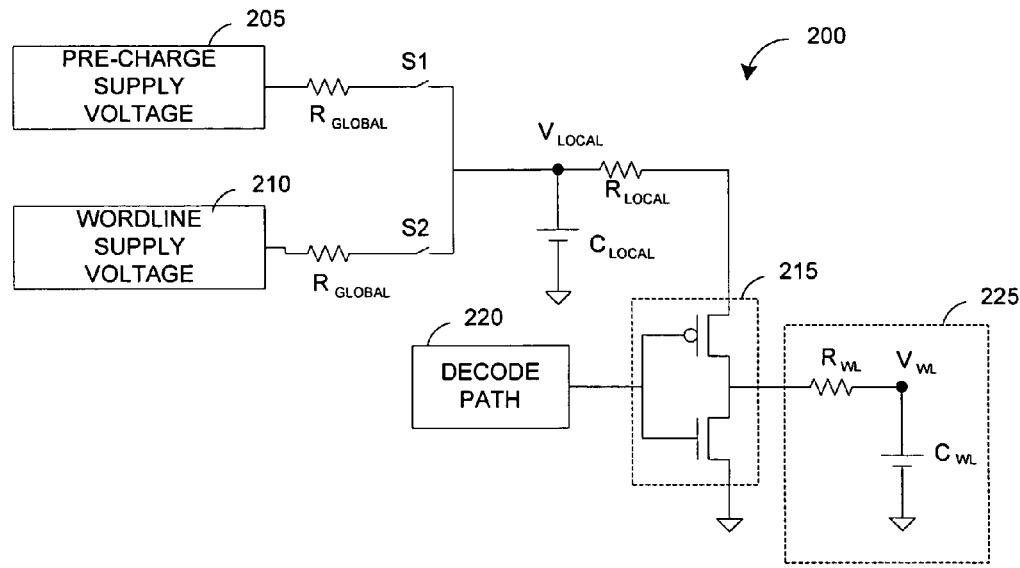
FIG. 2 is a schematic diagram illustrating a pre-charging circuit for pre-charging intermediate nodes in accordance with some embodiments of the present invention.

FIG. 2 is a block diagram of a circuit 200 for pre-charging an intermediate node for a high-speed wordline in accordance with some embodiments of the present invention. The circuit 200 may contain a pre-charge supply voltage 205 for providing a pre-charge voltage. The circuit 200 may also include a wordline supply voltage 210 for providing a wordline voltage. The pre-charge supply voltage 205 may be connected to a global load, $R_{GLOBAL}$, which in turn may be connected to a switch S1 that connects the pre-charge supply voltage 205 to a local capacitor, $C_{LOCAL}$. Similarly, the wordline supply voltage 210 may also be connected to a global load $R_{GLOBAL}$, which may be connected through a second switch S2 to the local capacitor $C_{LOCAL}$. The local capacitor $C_{LOCAL}$ may be connected to a wordline driver 215 through a local load, $R_{LOCAL}$, which may form an RC circuit.

The circuit 200 may also include a decode path 220 to select the appropriate wordline to access a particular memory cell. The decode path 220 may be connected to wordline driver 215, which may be used to drive the wordline when accessing a particular memory cell within the array. In some embodiments of the present invention, the wordline driver 215 may be a complimentary metal oxide semiconductor (CMOS) inverter that may contain a p-type MOS (PMOS) transistor and an n-type MOS (NMOS) transistor. The source of the PMOS transistor may be connected to the local load $R_{LOCAL}$, the drain of the PMOS transistor may be connected to the drain of the NMOS transistor, while the source of the NMOS transistor may be connected to the a reference voltage, such as ground. The output of the decode path 220 may be connected to the gate of both the PMOS transistor and the NMOS transistor, while the drains of both the NMOS and PMOS transistors may be connected to the output of the wordline driver 215. In operation, when the output of the decode path 220 is a logic "high", the NMOS transistor is "ON" while the PMOS transistor is "OFF." This may allow for a direct path between the wordline 225 and ground through the NMOS transistor, which may result in a "LOW" state, which may have a steady state value of approximately 0 volts across the wordline 225. On the other hand, when the output of the decode path is a logic "low", the NMOS transistor is "OFF" and the PMOS transistor may be "ON", which may drive the output of the wordline driver 215 to a "HIGH" state that may have the value of the voltage at the drain of the PMOS transistor, which in this case may be $V_{LOCAL}$.

A CMOS inverter utilized in the wordline driver 215 may provide several advantages for use as a switch in the present invention. First the "HIGH" and "LOW" output levels of the wordline driver may be equal to $V_{LOCAL}$ and ground, respectively. Thus, the voltage swing may be equal to the local voltage level VLOCAL, which may result in high noise margins. Second, the logic levels of the wordline driver 215 may not be dependent upon the relative device sizes, so the transistors may be minimal in size, which may reduce die size and manufacturing costs. Finally, the CMOS inverter may have a low output impedance, which may make it less sensitive to noise and disturbances.

The circuit 200 may also contain a wordline 225, which may be used to activate individual memory cells. In some embodiments, the wordline 225 may be represented by a simple RC circuit containing a wordline capacitor $C_{WL}$ and a wordline load $R_{WL}$.

The wordline supply voltage 210 may have a value $V_B$ equal to the supply voltage or the system voltage. However, the pre-charge supply voltage 205 may have a value that is greater than the wordline supply voltage 210 and may be greater than the voltage required to drive the wordline 225. This may allow the local voltage $V_{LOCAL}$ to have a value greater than the wordline voltage $V_B$. When switch S1 is closed, the pre-charge supply voltage 205 may charge the local capacitor $C_{LOCAL}$ to a value higher than the wordline supply voltage 210. The value of the pre-charge supply voltage 205 may be greater than the system voltage and the according to the following formula:

$$V_{LOCAL}*C_{LOCAL}+C_{WL}*0=(C_{LOCAL}+C_{WL})*V_{SHARED}$$

where $V_{SHARED}$ is the shared voltage level that lies between ground and the level of the value $V_B$ of the wordline supply voltage 210. In some embodiments, the value of the pre-charge supply voltage may be selected so that is greater than a value $V_B$ of the wordline supply voltage 210, but less than approximately twice the voltage value $V_B$. This may allow the shared voltage $V_{SHARED}$ to fall slightly below the value of the wordline supply voltage $V_B$.

To pre-charge the local capacitor $C_{LOCAL}$, the switch S1 may be closed and the output of the decode path may beset at a "HIGH" state. The "HIGH" state may place the NMOS transistor of the wordline driver 215 is an "ON" state so the output of the wordline driver 215 may be grounded or approximately zero volts. Next, the appropriate wordline may be selected through the decode path unit 220, which may set its output to a "LOW" value. The "LOW" value may be input to the wordline driver 215, which turns off the NMOS transistor and turns on the PMOS transistor. The output of the wordline driver 215 is then voltage at the drain of the PMOS transistor, which is $V_{LOCAL}$. Within a very short time, the charged stored on $C_{LOCAL}$ is shared with the wordline capacitor $C_{WL}$ so that an equal charge is carried by both capacitors (in the instance where $C_{LOCAL}$ and $C_{WL}$ may have the same value). However, the value of the charge across the wordline capacitor $C_{WL}$ may not be sufficient to activate the wordline 225. At this point, switch S1 may be opened to isolate the pre-charge supply voltage from the circuit 200 and switch S2 may be closed to connect the wordline supply voltage 210 to the circuit 200. Because the wordline capacitor $C_{WL}$ is partially charged, the wordline supply voltage 210 may only need to supply incremental charge to move the charge across the wordline capacitor $C_{WL}$ to its final value $V_B$.

Figure 3:
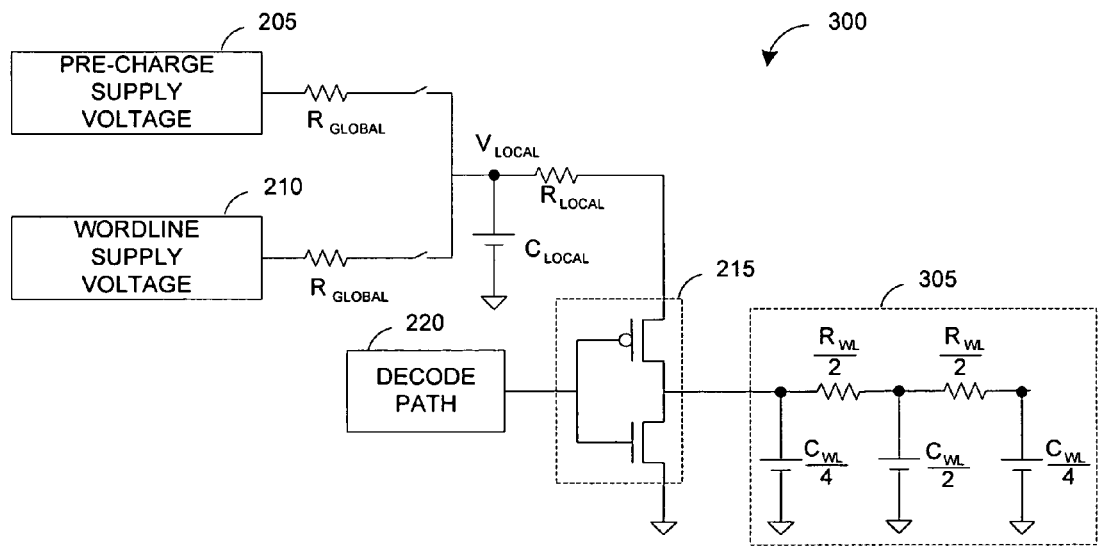
FIG. 3 is a schematic diagram illustrating another pre-charging circuit for pre-charging intermediate nodes in high-speed wordlines in accordance with some embodiments of the present invention.

FIG. 3 is another embodiment of a circuit 300 for pre-charging an intermediate node for high speed wordline in accordance with the present invention. Circuit 300 may be identical to circuit 200 described in FIG. 2, however, wordline 305 of the circuit 300 may contain a second order pi network rather than the simple RC network shown in FIG. 2.

Figure 4:
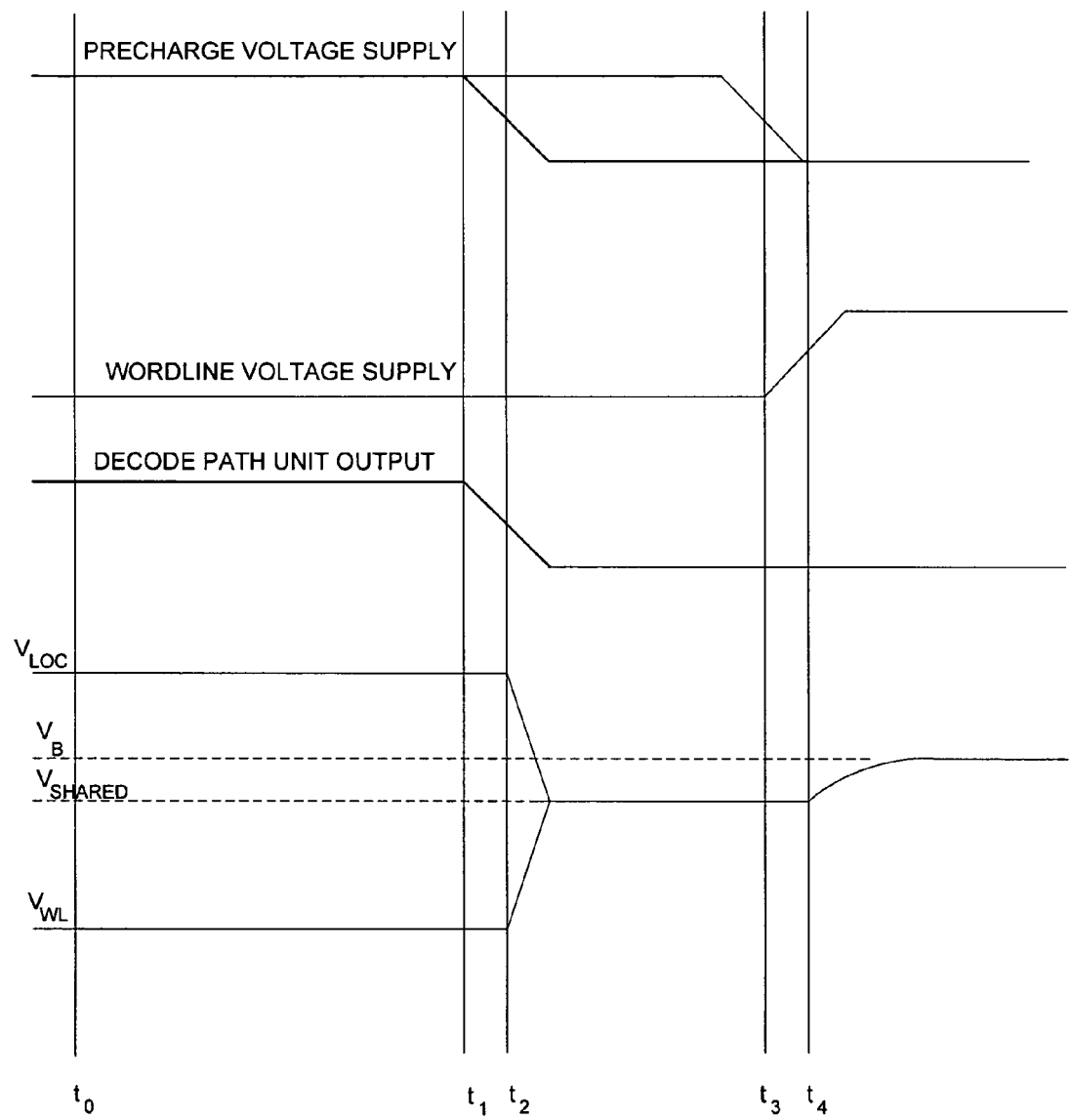
FIG. 4 is a timing diagram illustrating a timing sequence of a pre-charging circuit for pre-charging intermediate nodes in high-speed wordlines in accordance with some embodiments of the present invention.
Figure 5:
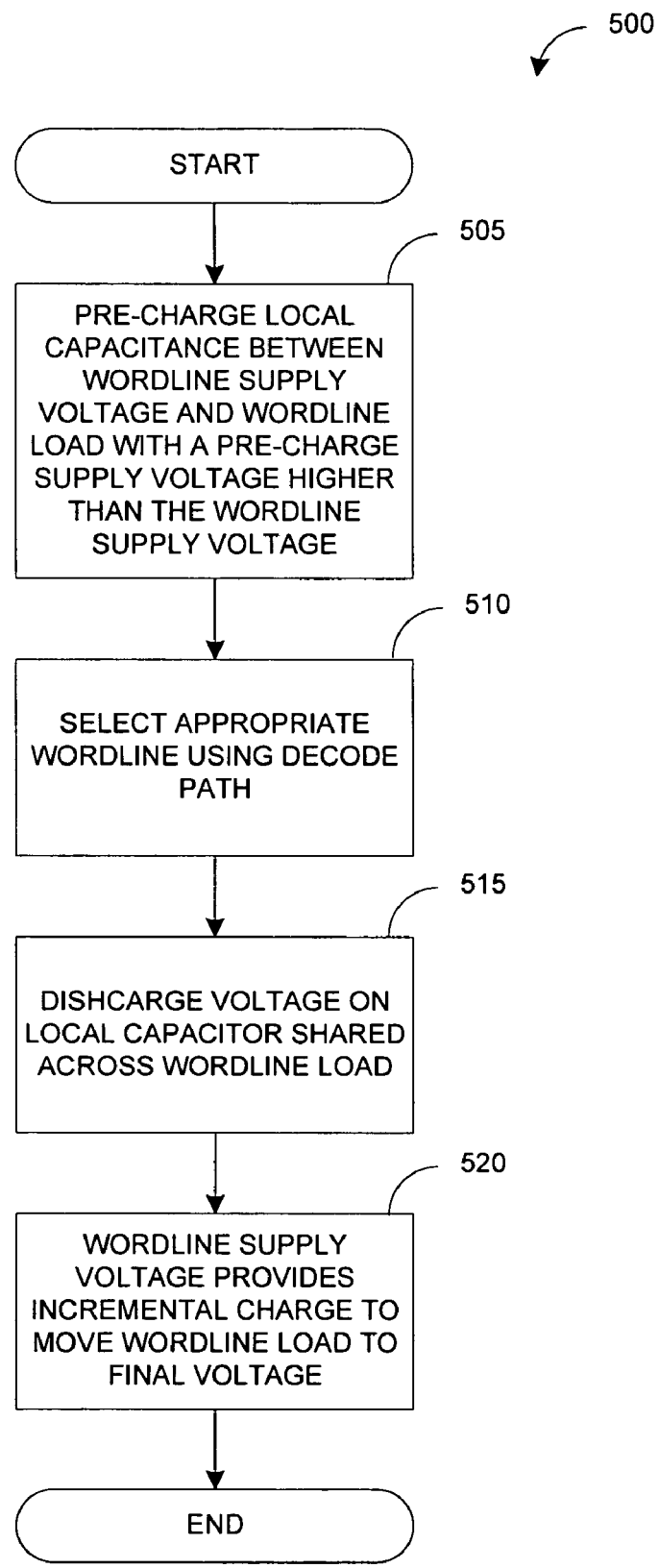
FIG. 5 is a logic flow diagram illustrating a method for pre-charging an intermediate node for a high-speed wordline in accordance with some embodiments of the present invention.

FIG. 4 is a timing diagram 400 illustrating the voltage levels through the circuit 200 in accordance with some embodiments of the present invention. FIG. 4 is explained in connection with the circuit 200 in FIG. 2, however the timing diagram may be equally applicable to circuit 300 depicted in FIG. 3. Between time $t_0$ and time $t_1$, switch S1 is closed so the local capacitor $C_{LOCAL}$ is charged to pre-supply voltage level. Also between $t_0$ and $t_1$, the output of the decode path unit 215 is held in the "HIGH" state so that the PMOS transistor of the wordline driver 215 is in the "OFF" state and the NMOS transistor is in the "ON" state, which will ground the wordline 225. At time $t_1$, the output of the decode path unit 220 may be switched from the "HIGH" state to the "LOW" state. At time $t_2$, PMOS transistor will switch from the "OFF" state to the "ON" state while the NMOS transistor may switch from the "ON" state to the "OFF" state to enable the wordline 225. At this point the local voltage $V_{LOCAL}$ that has built up across the local capacitor $C_{LOCAL}$ is discharged very rapidly and may charge the wordline capacitor $C_{WL}$, which is seen as an increase in the wordline voltage $V_{WL}$. At time $t_3$, the local voltage $V_{LOCAL}$ and the wordline voltage $V_{WL}$ may reach a common shared voltage level $V_{SHARED}$ that lies exactly between ground and $V_{LOCAL}$ but may still be less than the required voltage level $V_B$ needed to activate the wordline.

At time $t_3$, switch S1 is turned off to disconnect the pre-charge supply voltage 205 from the circuit 200 and switch S2 is closed to connect the wordline supply voltage 210 to the circuit 200. At time $t_4$, the wordline voltage $V_{WL}$ across the wordline capacitor $C_{WL}$ and the local voltage $V_{LOCAL}$ increase incrementally to voltage level $V_B$, which is the value of the wordline supply voltage 210. The rate at which the $V_{WL}$ increases between the voltage levels $V_{SHARED}$ and $V_B$ may be controlled by the RC response curve for the wordline capacitor $C_{WL}$ and the wordline resistor $R_{WL}$.

At 510, the appropriate wordline may be selected using the decode path unit 220. The decode path unit 220 may send a logic "LOW" signal to the wordline driver 215, which may close the path between the local capacitor $C_{LOCAL}$ and the wordline 225 by switching the PMOS transistor from an "OFF" state to an "ON" state while simultaneously switching the NMOS transistor from the "ON" state to the "OFF"

At 510, the appropriate wordline may be selected using the decode path unit 220. The decode path unit 220 may send a logic "LOW" signal to the wordline driver 220, which may close the path between the local capacitor $C_{LOCAL}$ and the wordline 225 by switching the PMOS transistor from an "OFF" state to an "ON" state while simultaneously switching the NMOS transistor from the "ON" state to the "OFF"

Once the PMOS transistor is placed in the "ON" state, the voltage $V_{LOCAL}$ across the local capacitor $C_{LOCAL}$ may be discharged to the wordline 225 at 515. In particular, the voltage $V_{LOCAL}$ that has built up across the local capacitor $C_{LOCAL}$ may be shared between the local capacitor $C_{LOCAL}$ and the wordline capacitor $C_{WL}$ of the wordline 225. For example if the local capacitor $C_{LOCAL}$ and the wordline capacitor $C_{WL}$ have equal capacitance values, the voltage $V_{LOCAL}$ across the local capacitor $C_{LOCAL}$ may be shared equally between the local capacitor $C_{LOCAL}$ and the wordline capacitor $C_{WL}$. Since the wordline capacitor $C_{WL}$ is isolated from the local capacitor $C_{LOCAL}$ through the wordline driver 215, the charge sharing may occur more rapidly than the response from the system supply voltage. The amount of charge across the wordline capacitor $C_{WL}$ may be controlled by adjusting the ratio of the local capacitor $C_{LOCAL}$ to the wordline capacitor $C_{WL}$. For instance, by increasing the value of the wordline capacitance $C_{WL}$, a greater portion of the shared charge may be stored across the wordline capacitor $C_{WL}$.

Additionally, varying the pre-charge supply voltage 205 may also affect the charge stored by the wordline capacitor $C_{WL}$. For instance, there may be a direct correlation between the value of the pre-charge supply voltage 205. Therefore, as the pre-charge supply voltage 205 increases, the charge across the wordline capacitor $C_{WL}$ may also increase. Therefore, by varying the ratio $C_{LOCAL}/C_{WL}$ and the value of the pre-charge supply voltage 205, it may be possible to achieve reasonable control over the final value of the shared charge across the wordline capacitor $C_{WL}$.

Once the charge that was stored on the local capacitor $C_{LOCAL}$ has been rapidly shared with the wordline capacitor $C_{WL}$, the resulting charge across the wordline capacitor $C_{WL}$ may not be great enough to activate the wordline 225. More than likely, the resultant charge across the wordline capacitor $C_{WL}$ will be slightly less than the charge required to activate the wordline 225. Therefore, at 520, the remaining charge to activate the wordline 225 may be supplied by the wordline supply voltage 210. The wordline supply voltage 210 may be brought into the circuit 200 by closing switch S2. The pre-charge supply voltage 205 may be simultaneously disconnected from the circuit 200 by opening switch S1. The wordline supply voltage 210 may only need to provide incremental charge to the wordline capacitor $C_{WL}$ to bring the level of the charge across wordline capacitor $C_{WL}$ to its final value to activate the wordline 225. By providing only an incremental charge, the response time of the wordline supply voltage 210 may be reduced over conventional Other alternative embodiments will become apparent to those skilled in the art to which an exemplary embodiment pertains without departing from its spirit and scope of the invention. Accordingly, the scope of the present invention is defined by the appended claims rather than the foregoing description.

We claim:

1. An apparatus, comprising:
a capacitor;
a first voltage for pre-charging the capacitor to a first voltage level;
a wordline driver for discharging at least a portion of the voltage on the capacitor across a wordline load,
wherein the portion of the voltage across the wordline load is less than a wordline voltage;
a second voltage for incrementally increasing the voltage across the wordline load to the wordline voltage; and
one or more switches for selectively connecting the capacitor to the first voltage and the second voltage.

2. The apparatus of claim 1, wherein the first voltage is greater than the second voltage.

3. The apparatus of claim 1, further comprising a pre-charge supply voltage for providing the first voltage.

4. The apparatus of claim 1, further comprising a wordline supply voltage for providing the second voltage.

5. The apparatus of claim 1, wherein the wordline driver comprises a complimentary metal oxide semiconductor (CMOS) inverter.

6. The apparatus of claim 5, wherein the CMOS inverter comprises:
a p-type metal-oxide semiconductor (MOS); and
an n-type MOS semiconductor, wherein the drain of the p-type NMOS transistor is connected to the drain of the n-type MOS semiconductor, the drain of the p-type NMOS and the drain of the n-type NMOS are connected to the wordline, and the gate of the p-type NMOS and the gate of the n-type NMOS are connected to a decode path selector.

7. The apparatus of claim 1, wherein the wordline load may be characterized by a resistor and a capacitor.

8. The apparatus of claim 1, wherein the wordline load may be characterized by a pi network.

9. A method comprising:

connecting a first capacitor to a pre-charge supply voltage;

pre-charging the first capacitor within an intermediate node to a first voltage level;

selecting at least one wordline load using a wordline driver;

discharging at least a portion of the first voltage across the at least one wordline load, wherein the at least a portion of the first voltage is less than a wordline voltage;

disconnecting the first capacitor from the pre-charge supply voltage;

connecting the first capacitor to a wordline supply voltage; and applying a second voltage across the wordline load until the voltage across the wordline load equals the wordline voltage.

10. The method of claim 9, wherein the wordline driver comprises a complimentary metal oxide semiconductor (CMOS) inverter.

11. The method of claim 10, wherein the CMOS inverter comprises:

a p-type metal-oxide semiconductor (MOS); and an n-type MOS (NMOS) transistor, wherein the drain of the p-type MOS (PMOS) transistor is connected to the drain of the n-type MOS semiconductor, the drain of the PMOS transistor and the drain of the NMOS transistor are connected to the wordline, and the gate of the PMOS transistor and the gate of the NMOS transistor are connected to a decode path selector.

12. The method of claim 9, wherein the wordline load may be characterized by a resistor and a capacitor.

13. The method of claim 9, wherein the wordline load may be characterized by a pi network.

14. The method of claim 11, further comprising:

closing a first switch to connect the first voltage to the first capacitor.

15. The method of claim 11, further comprising:

opening the first switch to disconnect the first voltage from the first capacitor; and closing a second switch to connect the second voltage to the first capacitor.

16. A system comprising:

a microprocessor;

a chipset connected to the microprocessor;

a graphical display device connected to the microprocessor, and a memory unit connected to the chipset, comprising:

at least one memory array;

a pre-charge circuit attached to the memory array comprising:

a capacitor;

a first voltage for pre-charging the capacitor to a first voltage level;

a wordline driver for discharging at least a portion of the voltage on the capacitor across a wordline load, wherein the portion of the voltage across the wordline load is less than a wordline voltage;

a second voltage for incrementally increasing the voltage across the wordline load to the wordline voltage; and one or more switches for selectively connecting the capacitor to the first voltage and the second voltage.

17. The system of claim 16, wherein the first voltage is greater than the second voltage.

18. The system of claim 16, further comprising a pre-charge supply voltage for providing the first voltage.

19. The system of claim 16, further comprising a wordline supply voltage for providing the second voltage.

20. The system of claim 16, wherein the wordline driver comprises a complimentary metal oxide semiconductor (CMOS) inverter.

21. The system of claim 20, wherein the CMOS inverter comprises:

a p-type metal-oxide semiconductor (PMOS) transistor; and an n-type MOS (NMOS) transistor, wherein the drain of the PMOS transistor is connected to the drain of the NMOS transistor, the drain of the PMOS transistor and the drain of the NMOS transistor are connected to the wordline, and the gate of the PMOS transistor and the gate of the NMOS transistor are connected to a decode path selector.

22. The system of claim 16, wherein the wordline load may be characterized by a resistor and a capacitor.

23. The system of claim 16, wherein the wordline load may be characterized by a pi network.

* * * * *